US009440195B2

(12) United States Patent
Montemagno

(10) Patent No.: US 9,440,195 B2
(45) Date of Patent: Sep. 13, 2016

(54) BIOMIMETIC MEMBRANE FORMED FROM A VESICLE-THREAD CONJUGATE

(75) Inventor: Carlo D. Montemagno, Glendale, OH (US)

(73) Assignee: Applied Biomimetic A/S, Nordborg (DK)

( * ) Notice: Subject to any disclaimer, the term of this patent is extended or adjusted under 35 U.S.C. 154(b) by 1531 days.

(21) Appl. No.: 13/123,208

(22) PCT Filed: Oct. 6, 2009

(86) PCT No.: PCT/DK2009/000216
§ 371 (c)(1),
(2), (4) Date: Jul. 11, 2011

(87) PCT Pub. No.: WO2010/040353
PCT Pub. Date: Apr. 15, 2010

(65) Prior Publication Data
US 2011/0259815 A1    Oct. 27, 2011

Related U.S. Application Data

(60) Provisional application No. 61/103,281, filed on Oct. 7, 2008.

(51) Int. Cl.
*B01D 71/80* (2006.01)
*B01D 69/12* (2006.01)
(Continued)

(52) U.S. Cl.
CPC .............. *B01D 69/125* (2013.01); *B01D 69/02* (2013.01); *B01D 69/144* (2013.01); *B82Y 10/00* (2013.01);
(Continued)

(58) Field of Classification Search
CPC  B01D 69/144; B01D 2323/30; B01D 71/80; B01D 69/02; B01D 69/10; B01D 61/027; B01D 67/0093; B01D 69/141; B01D 61/145; B01D 67/0088; B01D 69/00; B01D 69/12; B01D 69/125; A61K 9/1273; A61K 2039/55555; A61K 47/48815; A61K 9/1271; A61K 47/4883; A61K 9/127; A61K 9/5052; C12N 11/08; C12N 11/04; C12N 11/02; C12N 15/88
USPC .......... 210/500.27, 500.21, 490, 496, 500.1, 210/500.23, 500.29, 632, 653; 435/177, 435/180, 181, 182, 174, 176, 179; 427/244, 427/213.33
See application file for complete search history.

(56) References Cited

U.S. PATENT DOCUMENTS 3,736,204 A * 5/1973 Meriwether .................. 156/242
4,348,329 A * 9/1982 Chapman ....................... 554/80
(Continued)

FOREIGN PATENT DOCUMENTS

JP    07-035691    2/1995
JP    2001-091491    4/2001
(Continued)

OTHER PUBLICATIONS

Zuwei Ma, Seeram Ramakrishna; Electrospun regenerated cellulose nanofiber affinity membrane functionalized with protein A/G for IgG purification, Journal of Membrane Science 319 (2008) 23-28.*
(Continued)

*Primary Examiner* — David C Mellon
*Assistant Examiner* — Pranav Patel
(74) *Attorney, Agent, or Firm* — Yancy IP Law, PLLC

(57) ABSTRACT

The present invention relates to a method for producing man-made devices which have the properties and functions of biological membranes and membrane proteins, and to the structure of such devices.
Briefly, in one aspect of the invention, natural or genetically engineered proteins are incorporated into a polymeric vesicle that is conjugated to a thread to form a vesicle-thread conjugate. The engineered protein is preferably a transmembrane protein embedded in the wall of the polymeric vesicle. The vesicle-thread conjugate is then formed into a membrane or thin fabric having a wide variety of inherent functionality, including the ability to selectively transport and/or filter compounds between fluids. By selecting proteins with specific properties, membranes can be fabricated with a defined functionality including molecular scale addressability via directed electrostatic, electromagnetic, and chemical forces.

15 Claims, 4 Drawing Sheets

(51) Int. Cl.
*B01D 69/02* (2006.01)
*B01D 69/14* (2006.01)
*B82Y 10/00* (2011.01)
*B01D 61/02* (2006.01)
*H01G 9/20* (2006.01)
*H01L 51/00* (2006.01)
*H01L 51/05* (2006.01)

(52) U.S. Cl.
CPC ......... *B01D 61/025* (2013.01); *B01D 2323/30* (2013.01); *B01D 2323/345* (2013.01); *H01G 9/2059* (2013.01); *H01L 51/0093* (2013.01); *H01L 51/0595* (2013.01); *Y02W 10/37* (2015.05); *Y10T 428/2929* (2015.01); *Y10T 442/3106* (2015.04); *Y10T 442/612* (2015.04)

(56) References Cited

U.S. PATENT DOCUMENTS

| | | | | |
|---|---|---|---|---|
| 5,914,367 | A * | 6/1999 | Dordick et al. | 525/54.1 |
| 5,998,588 | A * | 12/1999 | Hoffman et al. | 530/402 |
| 6,537,575 | B1 * | 3/2003 | Firestone et al. | 424/484 |
| 7,208,089 | B2 | 4/2007 | Montemagno | |
| 2001/0034432 | A1 | 10/2001 | Sodroski | |
| 2002/0190000 | A1 * | 12/2002 | Baurmeister | 210/650 |
| 2004/0049230 | A1 | 3/2004 | Montemagno | |
| 2004/0242770 | A1 | 12/2004 | Feldstein | |
| 2006/0183166 | A1 | 8/2006 | Mayer | |
| 2007/0087328 | A1 | 4/2007 | Sleytr | |
| 2008/0317840 | A1 | 12/2008 | Lee | |
| 2011/0046074 | A1 * | 2/2011 | Kumar et al. | 514/21.2 |

FOREIGN PATENT DOCUMENTS

| | | |
|---|---|---|
| WO | 2004/101447 | 11/2004 |
| WO | 2006/122566 | 11/2006 |

OTHER PUBLICATIONS

Zheng-Ming Huang, Y.-Z. Zhang, M. Kotaki, S. Ramakrishna; A review on polymer nanofibers by electrospinning and their applications in nanocomposites, Composites Science and Technology 63 (2003) 2223-2253.*

Liu, et al., "Hierarchical self-assembling of dendritic-linear diblock complex based on hydrogen bonding", Polymer, Elsevier Science Publishers B.V., GB, 3759-3770, vol. 48, No. 13, Jun. 5, 2007.

Nardin, et al., "Hybrid Materials from amphiphilic block copolymers and membrane proteins", Reviews in Molecular Biotechnology, Elsevier, Amsterdam, NL, vol. 90, 17-26, No. 1, Mar. 1, 2002.

Ho, et al., "Block Copolymer-based Biomembranes Functionalized with Energy Transduction Proteins", Biological and Bioinspired Materials and Devices, Apr. 13-16, 2004, Mat. Res. Soc, Symp. Proc., vol. 823, 2004, pp. 187-192.

Soong, et al., "Powering an Inorganic Nanodevice with a Biomolecular Motor", Science, vol. 290, pp. 1555-1558, Nov. 24, 2000.

Cooper, et al., "Adsorption of Frog Foam Nest Proteins at the Air-Water Interface", Biophysical Journal, vol. 88, p. 2114-2125, Mar. 2005.

Mackenzie et al., "Ranasupumin-2: Structure and Function of a Surfactant Protein from the Foam Nests of a Tropical Frog", Biophysical Journal, vol. 96, p. 4984-4992, Jun. 2009.

Nikolov et al., "Ordered Micelle Structuring in Thin Films Formed from Anionic Surfactant Solutions", Journal of Colloid and Interface Science, vol. 133, No. 1, Nov. 1989.

Niewiadomski et al., "Dispersed Oil Impact on Froth Stability in Flotation", Physicochemical Problems of Mineral Processing, vol. 35, p. 5-19, 2001.

Doheny, et. al., "Cellulose as an inert matrix for presenting cytokines to target cells: production and properties of a stem cell factor—cellulose-binding domain fusion protein", Biochem. J. (1999) 339, p. 429-434 (Printed in Great Britain).

* cited by examiner

Amine-Ended PEtOz-PDMS-PEtOz

Joon-Sik Park, et al. *Macromolecules* 2004, 37, 6786-6792 carboxymethyl cellulose (CMC)

DCCI IS Dicyclohexyl carboddimide

Aminoethylcellulose (AE-Cellulose)

us 9,440,195 B2

BIOMIMETIC MEMBRANE FORMED FROM A VESICLE-THREAD CONJUGATE

BACKGROUND OF THE INVENTION

The present invention relates to a method for producing man-made devices which have the properties and functions of biological membranes and membrane proteins, and to the structure of such devices.

Biological membrane proteins have a large variety of functions, including acting as pumps, channels, valves, energy transducers, and mechanical, thermal, and electrical sensors, among many others. Since these proteins are nanometers in size and highly efficient, they are highly attractive for use in artificial devices. However, their natural lipid membrane environment suffers from shortcomings such as low strength, necessity of an aqueous environment, and susceptibility to chemical or bacterial degradation.

SUMMARY OF THE INVENTION

Briefly, in one aspect of the invention, natural or genetically engineered proteins are incorporated into a polymeric vesicle that is conjugated to a thread to form a vesicle-thread conjugate. The engineered protein is preferably a transmembrane protein embedded in the wall of the polymeric vesicle. The vesicle-thread conjugate is then formed into a membrane or thin fabric having a wide variety of inherent functionality, including the ability to selectively transport and/or filter compounds between fluids. By selecting proteins with specific properties, membranes can be fabricated with a defined functionality including molecular scale addressability via directed electrostatic, electromagnetic, and chemical forces.

The vesicle-thread conjugates of the invention can be designed and created so that they have the following properties as desired: the ability to form membranes of a desired thickness; the ability to form membranes of a desired chemical composition; the ability to form membranes of high strength; and the ability to increase the strength of already formed membranes as desired. One of the most important properties of the vesicle-thread conjugate is that they are able to house natural biological membrane proteins in a functional state, and that these conjugates are robust and long-lived, for by inserting biological membrane proteins into the vesicles, devices having the properties and functions of the proteins are created. Suitable vesicles should be sufficiently similar to natural lipid membranes as to permit easy insertion of the proteins when they are properly oriented and do not compromise the protein's natural function. Vesicles which satisfy these conditions are preferably formed from lipidized polymers or tri-block copolymers having general properties of hydrophilic outer blocks and hydrophobic inner blocks.

One aspect of the invention concerns the creation vesicle-thread conjugates wherein the vesicle includes two different proteins which, when acting in concert, result in a device which creates electricity from light, the "Biosolar Cell". Another aspect of the invention utilizes water transport proteins to enable water purification from arbitrary water sources. Descriptions of these aspects are given below.

As technological innovations resulting in device miniaturization have made electronics smaller, lighter, and more efficient, advances in sources of power for these devices have not progressed as rapidly. Power sources in the 21st century face the challenge of supplying energy to an increasing number of devices while decreasing in size and weight. In addition, tomorrow's products of nanotechnology and biotechnology will require power supplies that do not even resemble those used today in form or function.

There is a pressing need for lighter and more compact electrical power sources for a wide variety of emerging applications. Such power sources would enable a greater range of mission objectives than is achievable with modern battery technology, for maximizing the power density minimizes the weight needed to be carried for a given power requirement. The weight requirements are crucial since, for conventional fuel sources, the fuel source must be near the device and transported with it, if mobile. Exhaustion of the fuel is also likely and replenishment of that supply is then necessary. This can place a limit on the range and mobility of the user.

Contemporary science has shown the exciting potential promised in the development of nanobiotechnology. Manufacture of devices utilizing components in which no atom is wasted promises efficiency and miniaturization of the highest level. Although recent technical developments concerning power sources have been promising, they result from incremental improvements in existing technologies. Power sources ideally suited for the next generation of devices will utilize nanobiotechnology for their function and will also be able to power the present generation of devices at a high level of performance.

Only recently have the technology and knowledge necessary to develop the first nanobiotechnology devices become available, and the engineering and construction of nanometer scale organic/inorganic hybrid devices powered by the biochemical fuel ATP has been reported (Soong, R. K., Bachand, G. D., Neves, H. P., Olkhovets, A. G., Craighead, H. G., and Montemagno, C. D. (2000), Science 290, p. 1555 1558). The generation of ATP for use in these devices as well as the use of these devices to power other machines has motivated interest in the transfer of power between the macro- and nanometer scales as well as the interconversion of different types of energy.

In another aspect of the invention, other proteins with different functionality can be used to transport electrons/protons to enable the transduction of electrical and chemical power, and act as mechanical valves and sensors.

In a preferred form of the invention, the membrane is used to provide a biosolar-powered material and fabric which consists of vesicle-thread conjugates having a vesicle including biocompatible polymer membranes embedded with two energy converting proteins, bacteriorhodopsin and cytochrome oxydase, that will convert optical energy to electrical energy and deliver this energy to an external load. A tremendous weight savings results from the use of thin (less than 1 μm) polymeric membranes as well as the lack of a need to carry fuel with the power source. Thus, a system can be developed that can be integrated into clothing and the surfaces of most materials, providing an effectively weightless (less than 1 kg/m$^2$) source of energy with an efficiency equal to or greater than that achievable with solar cells. The biosolar power material thus forms a hybrid organic/inorganic power source that obtains its energy from light.

The process of the present invention relates to the manufacture of a thin fabric consisting of a vesicle-thread conjugate formed into biomimetic membranes and thin films. In one embodiment, the vesicle is a biocompatible polymer membrane embedded with two energy converting proteins, bacteriorhodopsin and cytochrome oxidase, that will convert optical energy to electrical energy and deliver this energy to an external load. These proteins have been separated and optimized by natural selection over millions of years to convert optical and electrical energy to electrochemical energy. Incorporated into a device, they provide useful amounts of power indefinitely and are sufficiently light, compact, and rugged for applications requiring high mobility in both hostile and friendly environments.

Bacteriorhodopsin is a bacterial protein that transports protons across a cell membrane upon the absorption of light. Cytochrome oxidase is a membrane protein that transports protons using high-energy electrons. These proteins are used in tandem to transform light energy into an electrochemical proton gradient that is subsequently converted to an electromotive force used to do external work. Because the device is a biological version of a conventional solar cell, there is no "fuel" to be carried along with the power supply, increasing the power density significantly. In addition, the maximum energy theoretically extractable from such a device is infinite, as it will work as long as the sun, or the device, does. The estimated areal mass density of the final device is .about. 100 g/m$^2$, providing an effectively weightless source of energy with an efficiency equal to or greater than that achievable with solar cells. The material composition and dimensions of this biosolar cell will ultimately result in large (>250 W/kg) power densities and large energy densities (800 Whr/kg for 3 hrs, 9500 Whr/kg for 3 days, 32000 Whr/kg for 10 days), enough to power a significant amount of equipment while effectively occupying zero volume and weight. In addition, there are negligible acoustic, thermal, and electronic signatures resulting from its operation.

There are important distinctions between the present power source and conventional solar cells, for since the present source is constructed from mass-produced proteins and common polymers, it will be lightweight, flexible, robust, and manufacturable in large quantities for low cost. The relevant length scale for this device is the thickness of the packaging, <1 μm. The membranes in which these enzymes normally exist have a thickness of 5 nm. Laminated sheets of the bio-solar cells can be incorporated into clothing and other surfaces that result in no weight cost, since they must be worn anyway. Appropriate modular design of the power-generating cells in the fabric will result in the ability of the power fabric to sustain significant damage and still retain functionality. The ability to interchange electrical and biochemical energy will enable the construction of electrically powered bio-devices as well as the conversion of biochemical fuel to electricity. The ability to transform energy between electrical, biochemical, and optical forms will allow the design and production of nanobiological devices unconstrained by the type of input energy.

BRIEF DESCRIPTION OF DRAWINGS

The foregoing, and additional objects, features and advantages of the present invention will be best understood from the following detailed description of preferred embodiments thereof, taken with the accompanying drawings, in which.

DESCRIPTION OF PREFERRED EMBODIMENTS

The contents of U.S. Pat. No. 7,208,089, entitled "Biomimetic membranes", is expressly incorporated herein by reference. The International patent application, PCT/US08/74163, entitled "Biomimetic Polymer Membrane that Prevents Ion Leakage", is expressly incorporated herein by reference. The International Patent application, PCT/US08/74165, entitled "Making Functional Protein-Incorporated Polymersomes", is expressly incorporated herein by reference. The U.S. Provisional application 61/055,207, entitled "Protein Self-Producing Artificial Cell, is expressly incorporated herein by reference.

Figure 1:
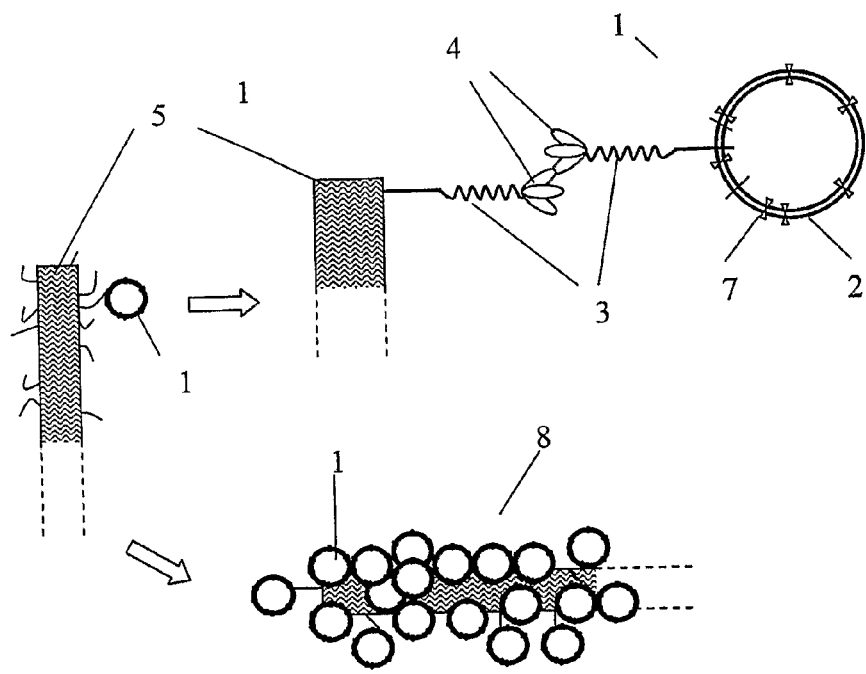
FIG. 1 is a schematic representation of the vesicle-thread conjugate in accordance with the present invention.
Figure 2:
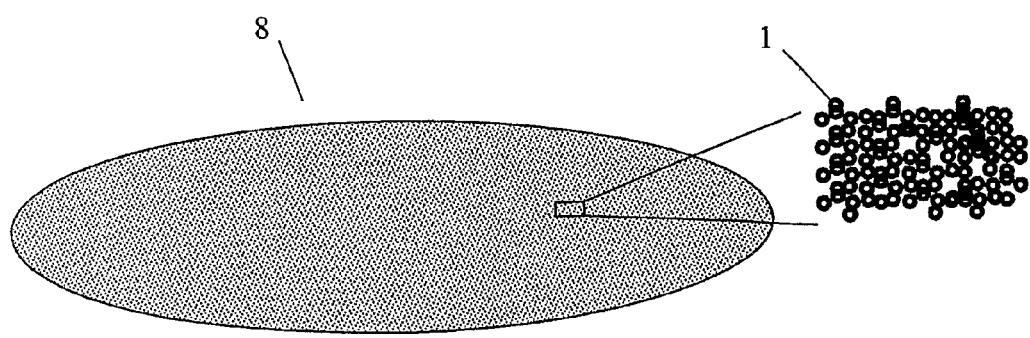
FIG. 2 illustrates the process required to produce a vesicle-thread conjugate in accordance with the present invention.

The present invention is directed to a vesicle-thread conjugate (1) as illustrated in FIG. 1 that may be formed into a biomimetic membrane or thin film (8). In a preferred embodiment, the thin film (8) is formed by weaving the vesicle-thread conjugates (1) into a fabric. In an alternate embodiment, the thin film (8) is formed by depositing vesicle-thread conjugates (1) into a "paper-making" arrangements wherein the conjugates adhere to one another. FIG. 1 shows a vesicle or polymersome (2) with proteins (7) of any kind embedded in the vesicle membrane. The vesicle (1) may comprise an ABA triblock copolymer (3) with cross-linking functional groups (4) linking them to a thread (5). Also shown is a thin film, or membrane, (8), being formed by a plural of such vesicle-thread conjugates (1). The conjugate is formed by providing a functionalized vesicle surface and a functionalized thread surface as shown in FIG. 2.

Figure 3:
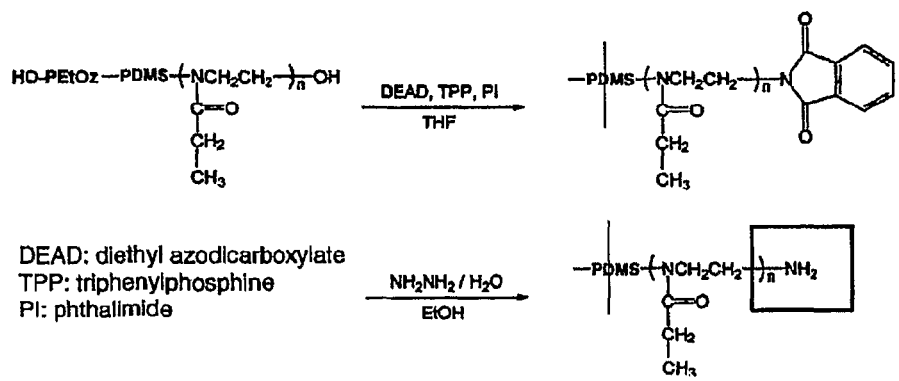
FIG. 3 illustrates one embodiment of the present invention where the vesicle surface is functionalized to produce an amine-ended PEtOz-PDMS-PEtOz vesicle.
Figure 4:
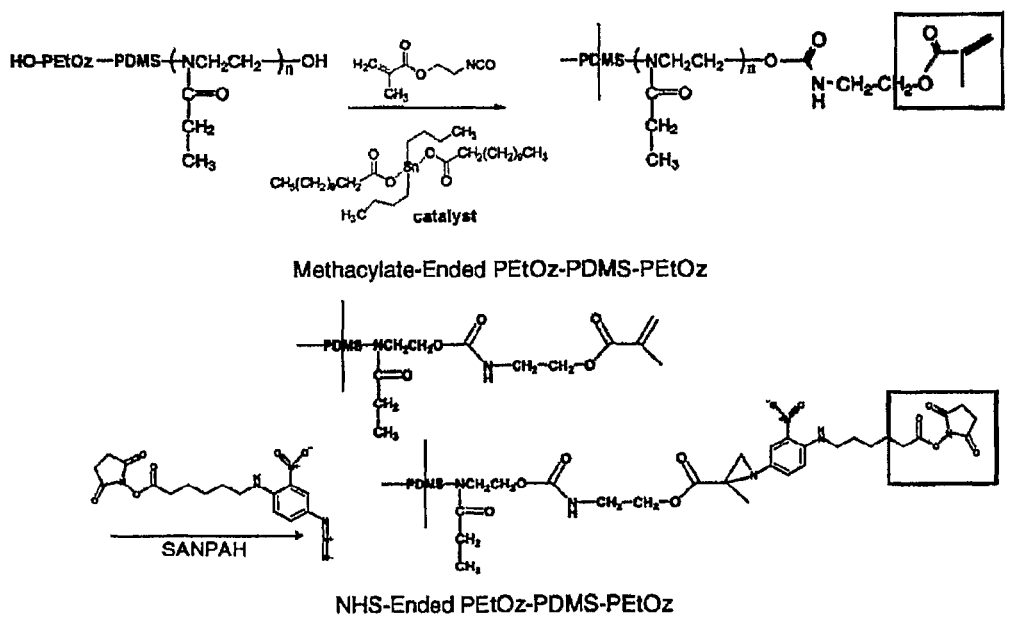
FIG. 4 illustrates alternate embodiment of the invention showing a methacylate-ended PEtOz-PDMS-PEtOz vesicle and a NHS-ended PEtOz-PDMS-PEtOz vesicle.

The vesicle is preferably a lipidized polymer or a tri-block copolymer as described in U.S. Pat. No. 7,208,089. FIG. 3 illustrates one embodiment of the present invention where the vesicle surface is functionalized to produce an amine-ended PEtOz-PDMS-PEtOz vesicle, see Joon-Sik Park, et al. Macromolecules 2004, 37, 6786-6792, the contents of which are expressly incorporated herein by reference. The vesicle surface may be functionalized using other known techniques. FIG. 4 shows a methacylate-ended PEtOz-PDMS-PEtOz vesicle and a NHS-ended PEtOz-PDMS-PEtOz vesicle. The selected functionality may vary depending on the type of thread used in the vesicle-thread conjugate. Furthermore, the type of polymer and functionalization may depend upon the type of protein incorporated into the vesicle.

Figure 5:
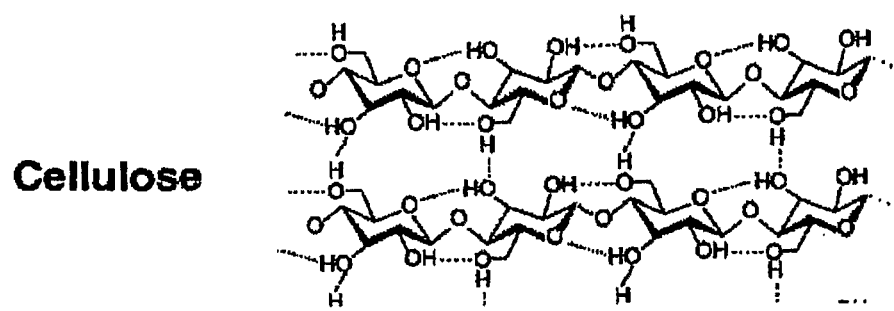
FIG. 5 illustrates the use of cellulose as the thread component in accordance with the present invention.
Figure 6:
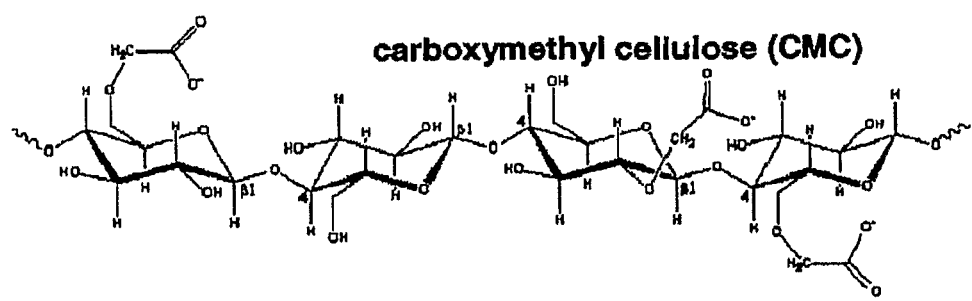
FIG. 6 illustrates the use of carboxymethyl cellulose (CMC) as the thread component in accordance with the present invention.
Figure 8:
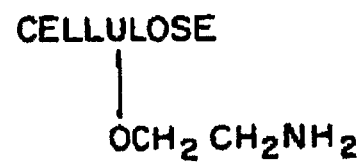
FIG. 8 illustrates the use of aminoethyl cellulose (AE-cellulose) as the thread component in accordance with the present invention.

The thread may be selected from a variety of available materials including, but not limited to, cellulose material, carboxymethyl cellulose (CMC), aminoethylcellulose (AE-cellulose) and nylon-based material. The preferred cellulose material is hydrophilic and insoluble to water and most organic solvents. As shown in FIG. 5, the multiple hydroxyl groups on the cellulose material form hydrogen bonds with oxygen molecules on another chain, holding the chains firmly together side-by-side and forming microfibrils with high tensile strength. Crystalline cellulose will become amorphous in water under the pressure of 25 MPa. The hydroxyl groups of cellulose can be partially or fully reacted with various reagents to afford derivatives with useful properties. Cellulose esters and cellulose ethers are the most important commercial materials, e.g. cellulose acetate, ethylcellulose, methyl-cellulose, hydroxypropyl cellulose, carboxymethyl cellulose, hydroxypropyl methyl cellulose, and hydroxyethyl methyl cellulose, to name a few. As shown in FIG. 6, another thread material may be a commercial available carboxymethyl cellulose (CMC). CMC is a cellulose derivative with carboxymethyl groups (—$CH_2$—COOH) bound to come of the hydroxyl groups. The polar (organic acid) carboxyl groups render the cellulose soluble and chemically reactive. Partially carboxymethylated cellulose at low degree of substitution (DS=0.2) retains its fibrous character while many of its properties differ from those of the original fiber. The average chain length and degree of substitution are of great importance; the more-hydrophobic lower substituted CMCs are thixotropic but more-extended higher substituted CMCs are pseudoplastic. At low pH, CMC may form cross-links through lactonization between carboxylic acid and free hydroxyl groups. FIG. 8 shows a thread formed from aminoethyl cellulose (AE-cellulose). AE-cellulose may be made by reacting cellulose with 2-aminoethyl-sulfuric acid in the presence of sodium hydroxide. AE-cellulose is commercial available from Whatman and has previously been used for chromatography columns and filters.

Figure 7:
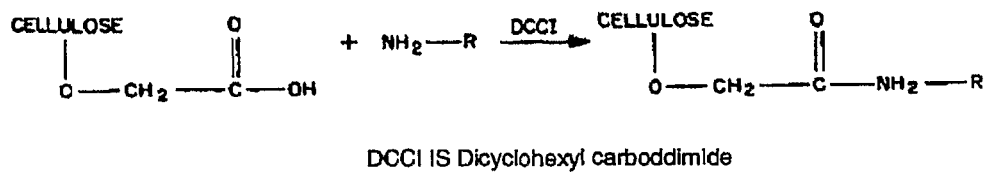
FIG. 7 illustrates the conjugation of a preferred vesicle with a preferred thread in accordance with the present invention.

FIG. 7 illustrates the conjugation of a preferred vesicle with a preferred thread. In this embodiment, a carboxymethyl cellulose (CMC) thread is reacted with an amine-functionalized vesicle in the presence of dicyclohexyl carbodiimide (DCCI). Alternatively, AE-cellulose will react with halides such as trichloromethylpurine or benzenesulfonyl chloride. It will also react with proteins and organic acids in the presence of carbodiimides such as dicyclohexylcarbodiimide.

In a preferred form of the invention, the vesicle-thread conjugate is woven into a fabric to produce a biomimetic membrane used to provide a biosolar-powered material and fabric which consists of a thin fabric incorporating a biocompatible polymer membrane embedded with two energy converting proteins, bacteriorhodopsin and cytochrome oxydase, that will convert optical energy to electrical energy and deliver this energy to an external load. A tremendous weight savings results from the use of thin (less than 1 μm) polymeric membranes as well as the lack of a need to carry fuel with the power source. Thus, a system can be developed that can be integrated into clothing and the surfaces of most materials, providing an effectively weightless (less than 1 kg/$m^2$) source of energy with an efficiency equal to or greater than that achievable with solar cells. The biosolar power material thus forms a hybrid organic/inorganic power source that obtains its energy from light.

In one form of the invention, bacteriorhodopsin and cytochrome oxidase are integrated into a vesicle that is further conjugated with a thread. The vesicle-thread conjugate is woven into a fabric that is in contact with microfabricated electrodes. The operation of the proposed device can be best understood after bacteriorhodopsin, cytochrome oxidase, and their integration into lipid and polymer membranes are understood. All three have been extensively studied and have a wide body of literature concerning their synthesis and function. For further details related to the energy-converting proteins and their incorporation into lipid and polymer membranes, see U.S. Pat. No. 7,208,089.

Because the diffusion of ions on membrane surfaces is large and can be made larger by the suitable choice of vesicles, the vesicle surface itself is all that is required for the successful functioning of the biosolar cell (Pitard et al., 1996). Vesicles, such as lipidized polymers or any one of many bio-compatible polymer matrices, contain the proteins and serve as proton barriers. These polymer matrices are very general, preferably requiring only that (a) they form vesicles which separate the top and bottom halves of the proteins when using transmembrane proteins, (b) they form an environment sufficiently similar to the natural lipid membrane so that the proteins can be easily inserted into the vesicle with the proper orientation, and (c) the local chemical environment of the vesicle experienced by the protein does not cause the protein to unfold or deform in such a way as to comprise the protein's natural function. Vesicles which satisfy-these conditions include, but are not limited to, lipidized polymers and tri-block copolymers having general properties of hydrophilic outer blocks and hydrophobic inner blocks. The protein-incorporated polymeric vesicles are preferably those described in U.S. Pat. No. 7,208,089 and International Patent application PCT/US08/74163. BR and COX are oriented and combined in the surface of the vesicles, and the membrane formed from the vesicle-thread conjugate is overlaid with electrodes.

There are many strategies employable to increase the proximity of the electrodes to the proteins, such as those provided in U.S. Pat. No. 7,208,089. An electrode grid may be placed directly on top of the lipid in the form of a thin wire mesh connected externally for electrical measurement. After removing the liquid above the top surface, a thin transparent layer of aluminum or nickel may be sprayed directly on the membrane to form the counter electrode. Alternatively, the electrodes may be electrochemically deposited onto the lipid surface by rastering the array of tips. This deposition would result in millions of nanoscale wires on the top surface of the membrane. The above steps are repeated and combined, resulting in oriented COX and BR contained in a lipid membrane.

There are two possible scenarios for the orientation of BR and COX: parallel and anti-parallel dipole orientation. If the dipoles are parallel, the alignment can be achieved for both, simultaneously, through the application of a single field. If they are anti-parallel, the large aggregate dipole moment of PM is utilized. The proper orientation will be achieved by the initial orientation of the COX in a high field followed by the orientation of PM in a field sufficiently small to avoid the perturbation of the COX, but large enough to sufficiently manipulate the PM fragments.

The use of polymer membranes in forming the vesicle is desirable for the following reasons: they have a longer lifetime than lipid membranes, they are more rugged, and they have more easily tailored properties, such as electron and ion conductivity and permeability. The interiors of these membranes must be hydrophobic and elastic so that the natural protein environment can be simulated as close as possible.

A wide variety of biocompatible polymers exist having a wide range of properties such as optical absorbance, polarity, electrical and ionic conductivity among others. Polymers enhancing the properties of the solar cells of the present invention must be compatible with the proteins and electrodes. Impermeability to protons is also important. The ability to dope the surface of the polymer may be significant, as it can play a major role in the proton conductivity and transmembrane conductance. The lifetime of the polymer as well as its effects of the lifetimes of the proteins contained within it are also relevant, and are factors in its selection. The choice of a polymer with a short lifetime but high performance may be useful in special applications.

The foregoing methods for the production of highly efficient and productive solar power sources made with biological components demonstrate the integration of energy converting biological proteins with an external device, and point the way toward a manufacturing pathway capable of large-scale production of biosolar cells capable of powering a wide variety of devices.

In another aspect of the invention, through the use of the Aquaporin family of proteins incorporated into tri-block co-polymer membranes, stable films are produced which will only pass water, thus facilitating water purification, desalinization, and molecular concentration through dialysis. The aquaporins exclude the passage of all contaminants, including bacteria, viruses, minerals, proteins, DNA, salts, detergents, dissolved gases, and even protons from an aqueous solution, but aquaporin molecules are able to transport water because of their structure. Further details related to the aquaporin family of proteins are disclosed in U.S. Pat. No. 7,208,089. Water moves through the membrane in a particular direction because of hydraulic or osmotic pressure. Water purification/desalination can be achieved with a two-chambered device having chambers separated by a rigid protein incorporated polymer membrane at its center that is filled with aquaporins. This membrane itself is impermeable to water and separates contaminated water in a first chamber from purified water in a second chamber. Only pure water is able to flow between the two chambers. Thus, when sea water or other contaminated water on one side of the membrane is placed under an appropriate pressure, pure water naturally flows into the other chamber. Accordingly, purified water can be obtained from undrinkable sources or, if the source of water contained chemicals of interest, the water can be selectively removed, leaving a high concentration of the wanted chemical in the input chamber. Importantly, however, the aquaporins are also suited to this invention for reasons other than their exclusive selectivity for water. Many members of this protein family, such as AquaporinZ (AqpZ) are extremely rugged and can withstand the harsh conditions of contaminated source water without losing function. AqpZ resists denaturing or unraveling from exposure to acids, voltages, detergents, and heat. Therefore, the device can be used to purify source water contaminated with materials that might foul or destroy another membrane, and it can be used in areas that experience consistently high temperatures.

AqpZ is also mutable. Since this protein is specifically expressed in host bacteria according to a genetic sequence that influences its final shape and function, a technician can easily change its genetic code in order to change the protein's characteristics. Therefore the protein can be engineered to fulfill a desired application that may be different from the protein's original function. For example, by simply changing a particular amino acid residue near the center of the water channel to cysteine, the Aquaporins produced would bind any free Mercury in the solution and cease transporting water due to the blockage. Thus, these mutant proteins used in a membrane device could detect Mercury contamination in a water sample by simply ceasing flow when the concentration of the toxic substance rises too high.

The preferred form of the invention has the form of a conventional filter disk because it is most easily assayed for functionality that way. To fabricate such a disk, a 5 nm thick monolayer of synthetic triblock copolymer and protein is deposited on the surface of a 25 mm commercial ultrafiltration disk using a Langmuir-Blodgett trough. The monolayer on the disk is then exposed to 254 nm UV light to cross-link the polymer and increase its durability. Lastly, a 220 nm pore size PVDF membrane is epoxy glued to the disk surface to ensure safe handling and prevent leakage at the edges.

The device is assayed by fitting it in a chamber that forces pressurized source water across the membrane. The device is considered functional when only pure water comes through the other side of the membrane and contaminating solutes remain concentrated in the originating chamber. The contaminated solution must be pressurized in order to overcome the natural tendency of pure water to flow into the chamber which has the higher number of dissolved particles. It is the purpose of the Aquaporin Z membrane to reverse osmosis and separate the pure water from contaminating solutes. This tendency, or osmotic pressure, of the system can be expressed in pounds per square inch (psi). For example, the osmotic pressure of seawater is roughly 360 psi.

There are several methods that can be used to allow the device to tolerate these types of pressures. Some varieties of polymer are naturally more durable than others, and can be cross-linked with UV light to provide extra rigidity. Another method is to add a high concentration of a non-toxic and easily removable solute to the freshwater chamber to encourage regular osmosis across the membrane while reverse osmosis is also occurring due to chamber pressurization. Lastly, the pressure required for reverse osmosis can be reduced by using multiple AqpZ devices in a cascade of sealed, connected chambers containing successively smaller concentrations of contaminants. The resulting pressure required to purify water in each pair of chambers is a fraction of the total pressure necessary for reverse osmosis. Therefore, each membrane only has to withstand a small pressure and has a greater chance of remaining intact. So, if the difference in concentration between each pair of chambers was only 10% instead of 100%, just 10% of the high pressure mentioned above would be needed to purify the source water at each junction. Pure water would be continuously produced in the final chamber with constant pressure and flow.

The aquaporin reverse osmosis membrane can purify water possessing several different types of contamination in only a single step. Traditional high purity systems require several components that can include a water softener, carbon filters, ion exchangers, UV or chemical sterilization, and a two pass reverse osmosis filter set to be used in conjunction before water (that is not as clean as aquaporin-purified water) can be produced. This elaborate set up cannot remove dissolved gases or substances smaller than 150 Daltons from the source water like the aquaporin membrane can. Furthermore, all these components require maintenance. UV bulbs require replacement and energy. Ion exchangers need to be chemically regenerated when they are full.

Softeners require salt. Carbon and reverse osmosis cartridges must be replaced when they become fouled. Finally, a single step device would require much less space and weigh far less than a typical purification system, and this advantage enables the Aquaporin water purification devices of the present invention to be portable.

Aquaporin membranes are also faster than conventional systems. A conventional high speed R.O. unit can make about 28.4 liters (7.5 gallons) of clean water every minute. Current research shows the movement of water molecules across an AqpZ saturated lipid membrane (0.0177 mm$^2$) at the rate of 54 μmoles/sec. (Pohl, P., Saparov, S. M., Borgnia, M. J., and Agre, P., (2001), Proceedings of the National Academy of Sciences 98, p. 9624 9629) Thus, a theoretical Aquaporin Z Reverse Osmosis Membrane with a surface area of 1.0 square meter could filter up to 3295 liters of pure water every minute. That rate is over 116 times faster than a normal purifier.

Lastly, new protein-based membranes are also very inexpensive to produce. The heart of the process, AqpZ, is easily harvested in milligram quantities from an engineered *E. coli* bacterial strain. On average, 2.5 mg of pure protein can be obtained from each liter of culture that is producing it. 10 mg of protein can be produced from about 5 dollars of growth media. That is enough protein for several full size devices. Also, the polymer in which the AqpZ is imbedded can be produced in the same laboratory for just pennies worth of chemicals for each device. The Aquaporin Z Reverse Osmosis Membrane is a novel, efficient, and inexpensive means of water purification.

Thus, there has been disclosed methods and apparatus utilizing biological components to achieve the highly efficient production of completely pure water from fouled, salty, or otherwise contaminated water. The invention demonstrates the integration of water transporting biological proteins with an external device, and points the way toward a manufacturing pathway capable of large-scale production of water purification devices.

Although the present invention has been described in terms of preferred embodiments, it will be understood that numerous variations and modifications of the methods and devices disclosed herein may be made without departing from the true spirit and scope of the invention, as set out in the following claims.

The invention claimed is:

1. A biomimetic membrane comprising a plurality of polymeric vesicles each conjugated to a thread to form a vesicle-thread conjugate wherein the thread comprises a cellulose material or a nylon-based material.

2. A biomimetic membrane according to claim 1, wherein the vesicle-thread conjugates have been formed by providing a functionalized vesicle surface and a functionalized thread surface.

3. A biomimetic membrane according to claim 1, in which a protein is incorporated into the walls of the plurality of vesicles.

4. A biomimetic membrane according to claim 1, in which the plurality of vesicles are formed from a tri-block copolymer having hydrophilic outer blocks and a hydrophobic inner block.

5. A biomimetic membrane according to claim 1, wherein the thread comprises cellulose, a cellulose ester or a cellulose ether.

6. A biomimetic membrane according to claim 5, wherein the thread comprises carboxymethyl cellulose, aminoethyl-cellulose, nano-crystalline cellulose or cellulose nanofibers.

7. A biomimetic membrane according to claim 1 formed by weaving the threads of a plurality of vesicle-thread conjugates into a fabric.

8. A biomimetic membrane according to claim 1 formed by depositing a plurality of vesicle-thread conjugates to form a sheet wherein the conjugates adhere to one another.

9. A biomimetic membrane according to claim 1 formed by a combination of weaving the threads of a plurality of vesicle-thread conjugates into a fabric, and depositing a plurality of vesicle-thread conjugates to form a sheet wherein the conjugates adhere to one another.

10. A biomimetic membrane according to claim 1, which is a water filtration membrane.

11. A biomimentic membrane according to claim 3, comprising vesicle-thread conjugates with different kinds of proteins incorporated into the wall of the vesicles.

12. A biomimetic membrane according to claim 3, wherein the protein incorporated into the wall of the vesicle comprises protein of the Aquaporin family.

13. A biomimetic membrane according to claim 3, wherein two energy converting proteins are incorporated into the walls of said plurality of vesicles.

14. A biomimetic membrane according to claim 13, wherein the two energy converting proteins are bacteriorhodopsin and cytochrome oxidase.

15. A power source comprising a biomimetic membrane according to claim 13, wherein the biomimetic membrane is in contact with microfabricated electrodes.

* * * * *